US006866987B2

(12) United States Patent
Lee

(10) Patent No.: US 6,866,987 B2
(45) Date of Patent: Mar. 15, 2005

(54) RESOLUTION AND PROCESS WINDOW IMPROVEMENT USING LIFT-OFF

(75) Inventor: Jiun-Ting Lee, Los Altos Hills, CA (US)

(73) Assignee: Headway Technologies, Inc., Milpitas, CA (US)

( * ) Notice: Subject to any disclaimer, the term of this patent is extended or adjusted under 35 U.S.C. 154(b) by 209 days.

(21) Appl. No.: 10/371,517

(22) Filed: Feb. 20, 2003

(65) Prior Publication Data

US 2004/0166419 A1 Aug. 26, 2004

(51) Int. Cl.$^7$ ................................................. G11B 5/127
(52) U.S. Cl. ........................... 430/311; 430/313; 430/5; 216/22; 216/47; 216/66; 360/313; 360/324; 29/603.01
(58) Field of Search ................................. 430/311, 313, 430/5; 216/22, 47, 66; 360/313, 324; 29/603.01

(56) References Cited

U.S. PATENT DOCUMENTS

| 5,491,600 | A | 2/1996 | Chen et al. | 360/113 |
| 6,165,693 | A | 12/2000 | Lin et al. | 430/311 |
| 6,303,252 | B1 | 10/2001 | Lin | 430/5 |
| 6,421,820 | B1 | 7/2002 | Mansfield et al. | 716/21 |
| 2002/0167764 | A1 * | 11/2002 | Fontana et al. | 360/313 |

* cited by examiner

Primary Examiner—John A. Mcpherson
Assistant Examiner—Daborah Chacko-Davis
(74) Attorney, Agent, or Firm—George D. Saile; Stephen B. Ackerman

(57) ABSTRACT

The invention teaches how to image and etch very narrow and isolated features without resorting to expensive OPC measures. Assist features are placed close to the main feature so that the local pattern density becomes semi-dense or dense and the pattern is imaged in a bilayer suitable for use in liftoff. The lower (easily etched) layer is then exposed to a suitable solvent so that the upper (etch resistant) layer is slowly undercut. Undercutting can be terminated as long as all the assist features have been lifted off. Although the original isolated feature will, in most cases, also have all of its lower layer removed, it does not lift off because, as a requirement of the process, at least one of its ends remains connected to an area of photoresist that is too wide to be fully undercut.

29 Claims, 3 Drawing Sheets

RESOLUTION AND PROCESS WINDOW IMPROVEMENT USING LIFT-OFF

FIELD OF THE INVENTION

The invention relates to the general field of photolithography with particular reference to reproduction of isolated features.

BACKGROUND OF THE INVENTION

The photolithographic process for the GPC (Giant magnetoresistance Permanent magnet Conductor) layer requires high resolution (smallest dimension) and the tightest control for CD (critical dimension) uniformity. With smaller and smaller design rules being introduced for the track width, a large process window or depth of focus is needed. Several resolution enhancement techniques can be used to widen the process window but each of these has its own limitations or is unsuitable for thin film head applications. For example, the cost of modifying masks by adding sub-resolution features generated by OPC (optical-proximity-correction) software is substantial.

As another example, off-axis illumination has been proven to improve both resolution as well as depth of focus but works well only in areas where the local pattern density (fraction of the area that is opaque) can be considered to be at least semi-dense (generally about 20% opaque).

The thin film head industry faces a unique situation in that there is often a need to form an etch mask containing a single isolated line in order to be able to etch through the topmost layers of a read head (typically a Giant Magneto Resistance, or GMR, stack). The present invention discloses how such a mask may be formed without the need to use expensive OPC techniques to assist in the formation of said mask, including said single isolated line.

A routine search of the prior art was performed with the following references of interest being found:

Mansfield et al. describe assist features for photolithographs in U.S. Pat. No. 6,421,820. In U.S. Pat. No. 6,303,252, Lin discloses assist features between! semi-dense lines. U.S. Pat. No. 6,165,693 (Lin et al) shows a method of designing assist features. None of these patents are in the magnetic recording field. U.S. Pat. No. 5,491,600 (Chen et al) is an example of a patent in the magnetic recording field showing a PMGI layer for lift-off of a photoresist.

SUMMARY OF THE INVENTION

It has been an object of at least one embodiment of the present invention to provide a process for manufacturing a MR read head, particularly the topmost, or GPC, layer.

Another object of at least one embodiment of the present invention has been to be able to image and etch very narrow, but isolated, features such as line segments.

Still another object of at least one embodiment of the present invention has been that the process used for imaging said narrow isolated features require no significant changes to the processes already being used for this purpose.

A further object of at least one embodiment of the present invention has been that said process not require the use of expensive, time consuming, OPC methods.

These objects have been achieved by temporarily increasing the pattern density in the immediate vicinity of the isolated feature through the addition of a number of dummy, or assist, features to the pattern. The etch mask, including these modifications is then implemented in a bilayer suitable for later use as a liftoff medium. The lower (easily etched) layer of said bilayer is then exposed to a suitable solvent (such as the developer itself) so that the upper (etch resistant) layer is slowly undercut. This undercutting can be terminated once all the assist features have been lifted off.

Although the original isolated feature will, in most cases, also have all of its lower layer removed, it does not lift off because, as a requirement of the process, at least one of its ends remains connected to an area of photoresist that is too wide to be fully undercut. The size of the undercut may be adjusted according to process requirements, providing the anchor area, which holds the original feature, does not lift off. Once selective removal of the assist features has been effected, the mask may be used for etching in the usual way by using one of several available processes in which etching occurs only in a direction normal, or close to normal, to the surface.

The invention is compatible with current MR head manufacturing processes and no special masks are needed. The design of the assist features can be optimized according to the available illumination tools, making the cost of the mask much lower than if OPC had been used together with PSM techniques. The number of masks needed is also less compared to that of conventional isolated-line design. The process window of the GPC layer is thus increased significantly.

DESCRIPTION OF THE PREFERRED EMBODIMENTS

We will disclose the present invention by describing a process for forming the GPC portion of a magneto-resistive read head it will, however, be understood by those skilled in the art that the invention is more general than this and can be applied to many situations where a single, very narrow and isolated, feature needs to be formed by an etching process.

The process is best understood by first seeing the end product that it is intended to produce. This is shown in schematic cross-section in FIG. 6. Seen there is substrate 21 (normally a layer of ferromagnetic material that will serve as a lower shield) on which has been deposited a series of layers having various magnetic properties and thicknesses which, together, constitute GMR stack 22. Stack 22 has been etched into the shape shown so that longitudinal bias layer(s) 23 can abut its upper, vertical, portion. Conductive lead layer 24 has been deposited thereon but not onto surface 11 which is the portion of the read head that flies over the ABS (air bearing surface).

Figure 1:
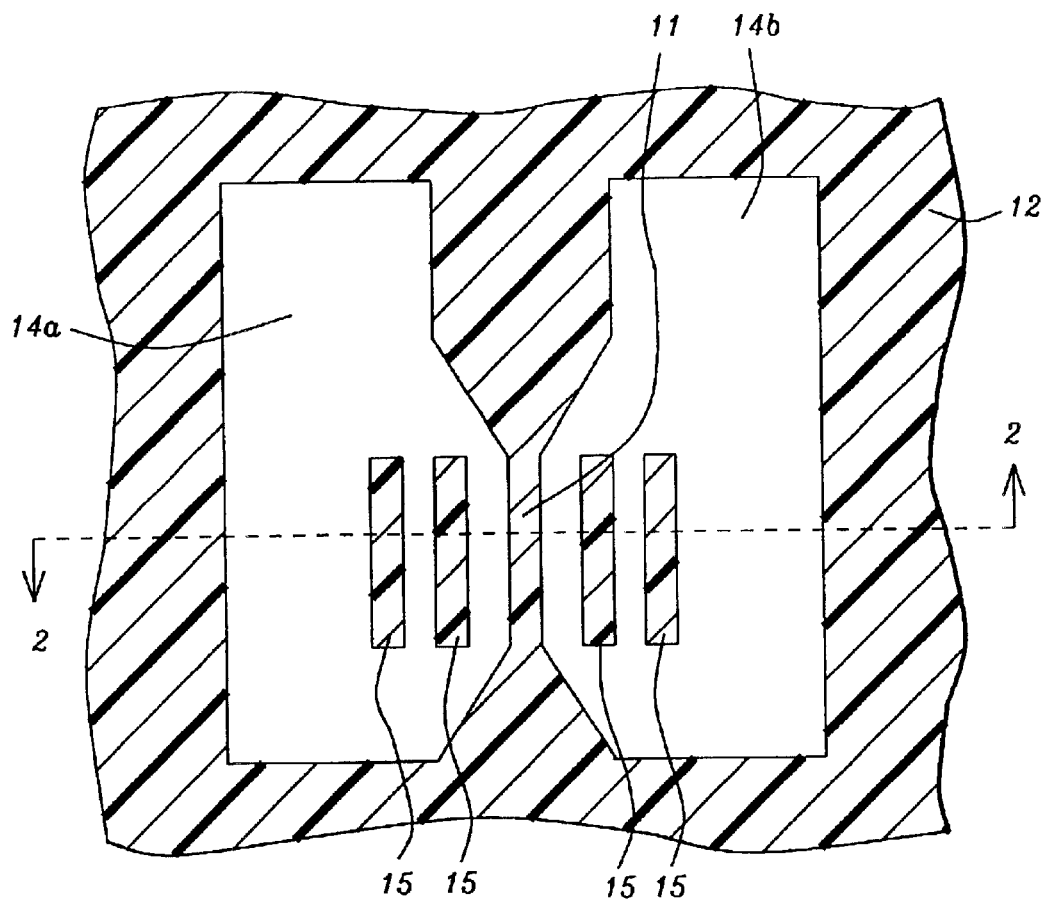
FIG. 1 illustrates the mask used to implement the present invention.

Referring now to FIG. 1, we show a plan view of portion of photoresist layer 12 which has been patterned into the shape shown by exposure to actinic radiation in the form of a reduced image projected from a reticle. The pattern carried on the reticle includes two areas 14a and 14b that are separated from one another by narrow region 11 that defines the track width of the read head. Currently region 11 would be less than about 0.3 microns wide. It is to be noted that narrow region 11 is connected at its ends to the main body of photoresist which is serving as a common enclosure for 14a and 14b.

In prior art practice, the pattern seen in FIG. 1 would be limited to elements 11, 12, 14a and 14b. When the width of element 11 approached the resolution limit of the total optical system steps would have had to be taken to cancel out optical proximity effects. As already noted, this can be both expensive and of limited success, particularly because region 11 is an isolated feature so techniques such as off-axis illumination do not work well.

In order to solve this problem, the present invention temporarily increases the pattern density in the vicinity of feature 11 by adding (to the reticle pattern) additional free-standing elements 15. These temporary features need have no particular shape (although line features disposed to lie parallel to element 11 are preferred) and their spacing relative to element 11 or to one another is not critical—so long as they increase the pattern density in the immediate vicinity of 11. In general, they will be resolved by the optical system, appearing in the developed photoresist image, so they are not to be confused with scattering bars that, while present on the reticle, do not appear in the photoresist image.

Figure 2:
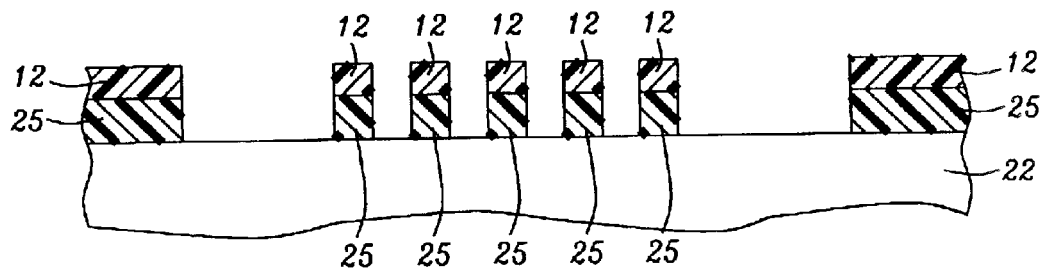
FIG. 2 is a cross-section through part of FIG. 1
Figure 6:
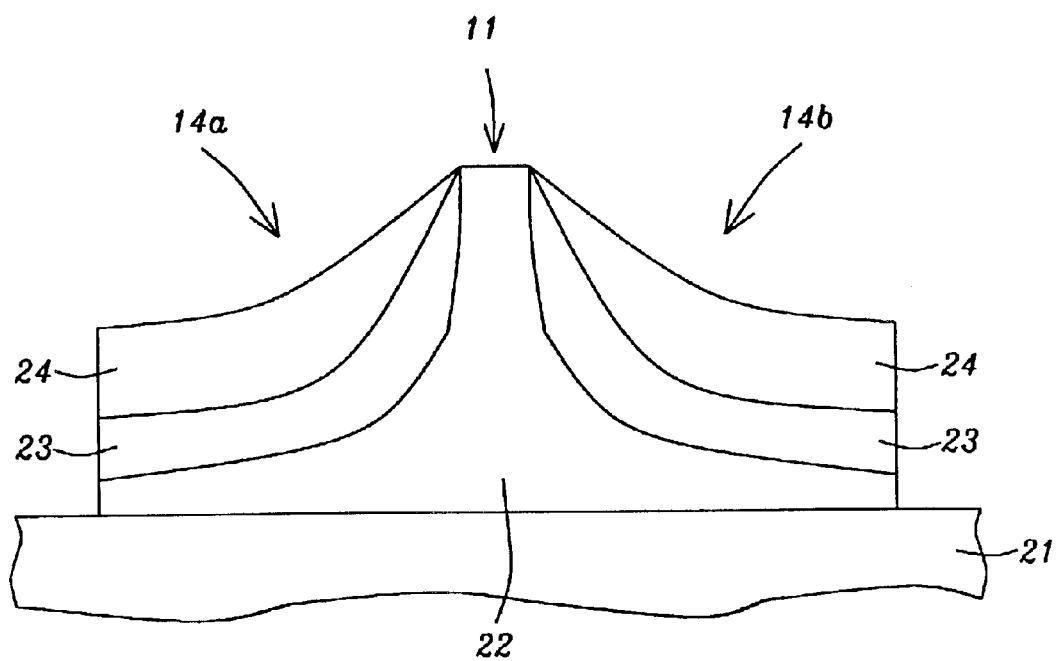
FIG. 6 is a cross-section through part of FIG. 5.

FIG. 2 is a cross-section of FIG. 1 taken through 2—2. Layer 22 represents the topmost layer(s) of the GMR stack as shown in FIG. 6 but before it has been etched into the shape seen in FIG. 6. The key feature illustrated in FIG. 2 is that photoresist layer 12 does not lie directly on 22, but rather on layer 25. Layer 25 is of a material that is highly soluble in at least one etchant and that is patternable through development following selective exposure to radiation. This is in contrast to layer 12 which, though also patternable through development following selective exposure to radiation, is resistant to etching, i.e. photoresist. Note that 'radiation' in this context could be light having a wavelength between about 1,590 and 3,650 Angstroms or it could be an electron beam.

Layers 25 and 12 together form a bilayer which is treated as a single layer for the purposes of exposure to radiation and subsequent development. The result is a bilayer etch mask suitable for use in a liftoff process. Typical examples of materials suitable for use in layer 25 include (but are not limited to) PMGI (polymethylglutarimide) while the thickness of layer 25 was typically between about 0.01 and 1 microns. In the case of layer 12, typical examples of suitable materials include (but are not limited to) D2N (diazoquinone) and PHS (polyhydroxystyrene) while the thickness of layer 12 was typically between about 0.05 and 5 microns.

Now follows another key feature of the invention. After normal development, etching of layer 25 is allowed to continue so that layer 12 is steadily undercut. This step may be performed using a separate etchant or the latter may be included in the composition of the developer so achieving the required degree of undercutting becomes a matter of controlled over-development. Either way, the consumption from its edges of layer 25 (schematically shown as region 31 in FIG. 3) is allowed to proceed until it has been completely removed from under assist features 15 so that they lift off substrate 22 and are washed away.

Figure 3:
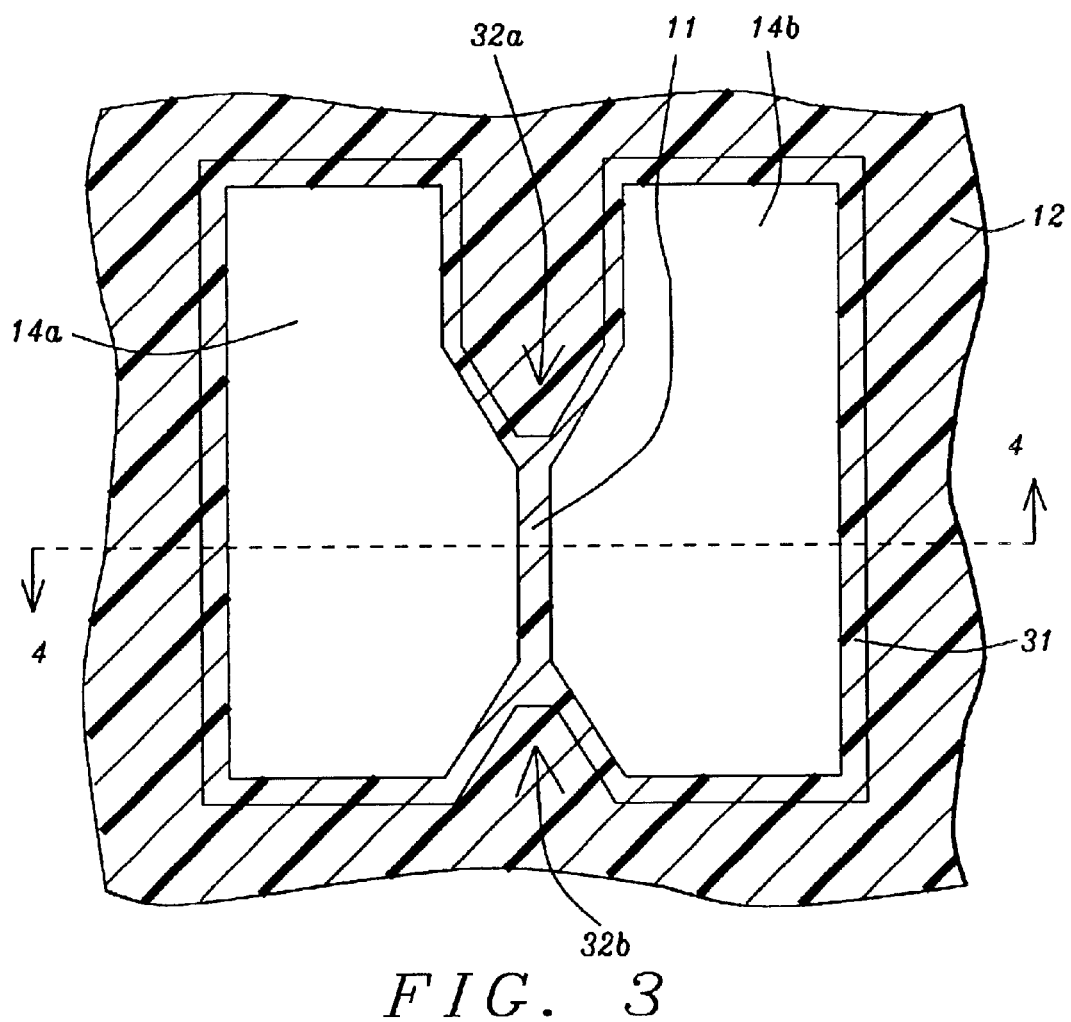
FIG. 3 shows the mask of FIG. 1 after selective removal of certain portions thereof.
Figure 4:
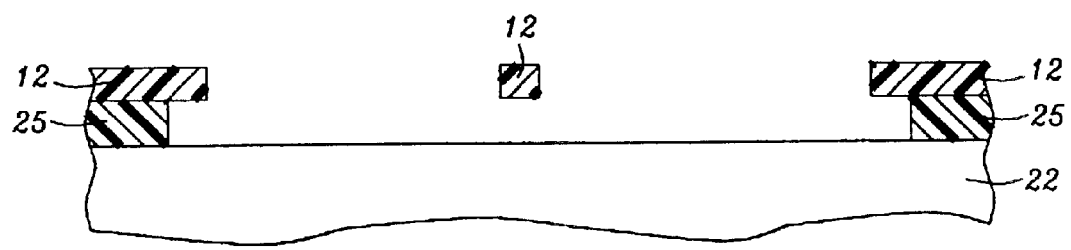
FIG. 4 is a cross-section through part of FIG. 3.

It is important to note that, unless feature 11 was wider than the assist features 15, it, too, will have had all of layer 25 beneath it removed. However, unlike elements 15, element 11 is attached to the main body of photoresist 12 at both its ends. So, even after layer 25 has been removed from under it, it remains in position, being suspended, bridge-like, between locations 32a and 32b of the main body of photoresist, as shown in FIG. 3. This can be seen in the cross-section 4—4 shown in FIG. 4 where centrally located photoresist stripe 12 appears to be floating but is actually anchored at points above and below the plane of the figure.

Despite the fact that it is not always in contact with substrate 22, photoresist mask 12 can still be effectively employed during an etching procedure, provided etching only occurs in a direction normal, or near normal, to the substrate surface. Examples of etching methods that satisfy this condition include (but are not limited to) Reactive Ion Etching (RIE) and Ion Beam Milling (IBE).

Figure 5:
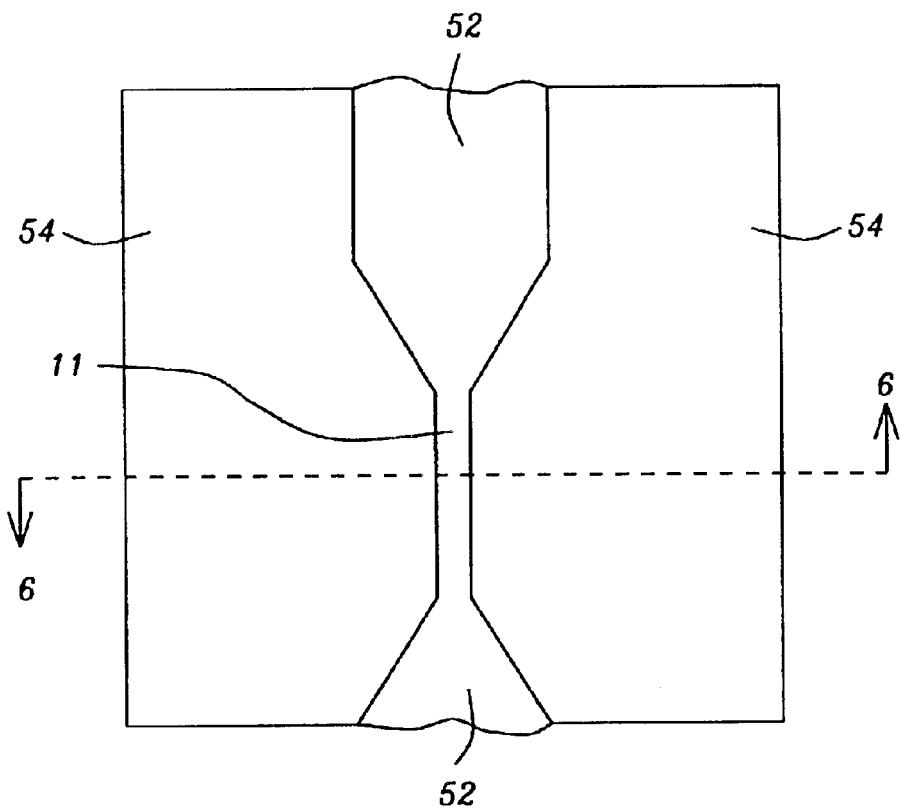
FIG. 5 is a plan view of the structure following application of the process of the present invention.

Thus, once removal of the assist elements 15 has been completed, etching of layer 22 can proceed, resulting in the formation of cavities 54 with the topmost part of layer 22 being given the shape 52 seen, in plan view, in FIG. 5. The depth to which GMR stack 22 is etched is between about 0.01 and 0.1 microns. This is followed by the deposition, in succession, of one or more layers 23 suitable for providing permanent magnetic bias followed by layer 24 of a conductive material suitable for use in a pair of leads that flank the GMR stack, as seen in FIG. 6.

After layers 23 and 24 have been deposited, the exposure of layer 25 to the solvent is allowed to continue for as long as it takes to achieve complete liftoff of all deposited material that was in contact with photoresist layer 12, thereby exposing areas 11 and 52 (FIG. 5).

As already noted, the invention is not limited to magnetic head applications. Thus whenever a very narrow, but isolated, feature is to be imaged in photoresist the process described above may be used. To achieve selective removal of the assist features, it is necessary that the isolated feature be attached in some way to photoresist that has not been completely undercut. This could be accomplished as described above or the assist features could be made narrower than the isolated feature. In cases where this would not be a problem, the isolated feature may have one or two small portions of its length widened, e.g. giving it a barbell shape or it could be briefly widened at only a single, though centrally located, point etc. etc.

The invention is most useful for the imaging of isolated features when, prior to adding the assist features, there is a pattern density of up to about 40% within a distance of 10 microns from the isolated feature and when, after adding the assist features, the pattern density has been increased to between about 20 and 80%. Application of the invention can be effected without in any way interfering with the application of other aids to improved resolution such as phase shifting masking (particularly for ultra-small resolution requirement, e.g., 90 nm using a 248 nm wavelength light source) or (as noted earlier) off-axis illumination.

The invention is compatible with current MR head manufacturing processes and no special masks are needed. The design of the assist features can be optimized according to the available illumination tool, making the cost of the mask much less than if OPC had been used. The number of masks needed is also less compared to that of conventional isolated-line design in association with PSM techniques. The process window of the GPC layer is thus increased significantly.

What is claimed is:

1. A process to form a patterned mask, including a first isolated feature, comprising:

providing a reticle bearing a pattern that includes said first feature;

adding to said pattern one or more second features located close to said first features, whereby said first feature becomes part of a densely populated section of said pattern;

providing a substrate and coating it with a first layer of a material that is highly soluble in an etchant and that is patternable through development following selective exposure to radiation;

coating said first layer with a second layer of a material that is resistant to etching and that is patternable through development, following selective exposure to radiation, thereby forming a bilayer;

exposing said bilayer to a radiated image of said reticle pattern and then developing said bilayer, whereby said pattern forms on the substrate; and using said etchant, removing part of said first layer thereby undercutting the second layer to a degree sufficient to remove said second features through lift-off while leaving said first feature in place.

2. The process described in claim 1 wherein the step of leaving said first feature in place further comprises having, as part of said pattern, a connection between said first feature and a part of said pattern that is too wide to be removed as a result of said undercutting step.

3. The process described in claim 1 wherein the step of leaving said first feature in place further comprises making said second features narrower than said first feature.

4. The process described in claim 1 wherein the step of leaving said first feature in place further comprises making a portion of said first feature wider than any of said second features.

5. The process described in claim 1 wherein said etchant is also used for developing said bilayer.

6. The process described in claim 1 wherein said first layer is PMGI.

7. The process described in claim 1 wherein said first layer is desposited to a thickness between about 0.01 and 1 microns.

8. The process described in claim 1 wherein said second layer is D2N or PHS.

9. The process described in claim 1 wherein said second layer is desposited to a thickness between about 0.05 and 5 microns.

10. The process described in claim 1 wherein, prior to adding said second features and within 10 microns from said first feature, the a pattern density is up to about 40%.

11. The process described in claim 1 wherein, after adding said second features and within 10 microns from said first feature, there is a pattern density of between about 20 and 80%.

12. The process described in claim 1 wherein the exposing radiation is light having a wavelength between about 1,570 and 3,650 Angstroms.

13. The process described in claim 1 wherein the exposing radiation is an electron beam.

14. The process described in claim 1 wherein said first isolated feature has a minimum width that is less than about 1 micron.

15. The process described in claim 1 wherein exposing said bilayer to said radiated image further comprises use of off-axis illumination.

16. The process described in claim 1 wherein said reticle is a phase shifting mask.

17. The process described in claim 1 wherein said second features are not scattering bars.

18. A process for etching a magnetic read head, comprising:

providing a GMR stack having a topmost layer;

providing a reticle bearing a pattern that defines two areas, located within a common enclosure, said areas being separated by a narrow region that defines a track width for said read head, with said narrow region being connected at its ends to said common enclosure;

including in said pattern one or more unconnected line features disposed to lie parallel to said narrow region;

coating said topmost layer with a first layer of a material that is highly soluble in an etchant and that is patternable through development following selective exposure to radiation;

coating said first layer with a second layer of a material that is resistant to etching and that is patternable through development, following selective exposure to radiation, thereby forming a bilayer;

exposing said bilayer to a radiated image of said reticle pattern and then developing said bilayer, whereby a bilayer etch mask is formed on said topmost layer;

using said etchant, removing part of said first layer thereby undercutting the second layer to a degree sufficient to remove said unconnected line features through lift-off, while leaving said narrow region in place;

then, using said etch mask, etching said GMR stack to a depth;

then depositing, in succession, one or more layers suitable for providing permanent magnetic bias followed by a layer of conductive material; and then exposing said first layer to said solvent until said second layer is lifted off, including all material thereon.

19. The process described in claim 18 wherein said etchant is also used for developing said bilayer.

20. The process described in claim 18 wherein said first layer is PMGI.

21. The process described in claim 18 wherein said first layer is deposited to a thickness between about 0.01 and 1 microns.

22. The process described in claim 18 wherein said second layer is D2N.

23. The process described in claim 18 wherein said second layer is deposited to a thickness between about 0.05 and 5 microns.

24. The process described in claim 18 wherein the exposing radiation is light having a wavelength between about 1,570 and 3,650 Angstroms or it is an electron beam.

25. The process described in claim 18 wherein said narrow region has a minimum width that is less than about 1 micron.

26. The process described in claim 18 wherein exposing said bilayer to said radiated image further comprises use of off-axis illumination.

27. The process described in claim 18 wherein said reticle is a phase shifting mask.

28. The process described in claim 18 wherein the step of etching said GMR stack to a depth is performed using ion beam milling or reactive ion beam etching.

29. The process described in claim 18 wherein the depth to which said GMR stack is etched is between about 0.01 and 0.1 microns.

* * * * *